United States Patent
Yamamoto et al.

(10) Patent No.: US 6,737,722 B2
(45) Date of Patent: May 18, 2004

(54) LATERAL TRANSISTOR HAVING GRADED BASE REGION, SEMICONDUCTOR INTEGRATED CIRCUIT AND FABRICATION METHOD THEREOF

(75) Inventors: Makoto Yamamoto, Saitama-ken (JP); Akio Iwabuchi, Saitama-ken (JP)

(73) Assignee: Sanken Electric Co., Ltd., Saitama-Ken (JP)

( * ) Notice: Subject to any disclaimer, the term of this patent is extended or adjusted under 35 U.S.C. 154(b) by 0 days.

(21) Appl. No.: 10/014,949

(22) Filed: Oct. 26, 2001

(65) Prior Publication Data
US 2002/0158270 A1 Oct. 31, 2002

(30) Foreign Application Priority Data
Apr. 25, 2001 (JP) .................... P2001-128187

(51) Int. Cl.[7] .................. H01L 29/00; H01L 29/06; H01L 29/207
(52) U.S. Cl. ............... 257/500; 257/525; 257/526; 257/566; 257/575; 257/653; 257/655
(58) Field of Search ............... 257/500, 525, 257/526, 566, 575, 653, 655

(56) References Cited

U.S. PATENT DOCUMENTS

| | | | | |
|---|---|---|---|---|
| 4,149,906 A | * | 4/1979 | De La Moneda | 148/1.5 |
| 4,196,440 A | * | 4/1980 | Anantha et al. | 357/44 |
| 4,326,212 A | * | 4/1982 | Bergeron et al. | 357/46 |
| 5,665,994 A | * | 9/1997 | Palara | 257/378 |
| 5,708,290 A | * | 1/1998 | Cacciola et al. | 257/500 |
| 6,033,947 A | * | 3/2000 | Cacciola et al. | 438/202 |
| 6,225,181 B1 | * | 5/2001 | Gregory | 438/355 |
| 6,242,793 B1 | * | 6/2001 | Colombo et al. | 257/556 |

FOREIGN PATENT DOCUMENTS

EP 545488 * 9/1993

* cited by examiner

Primary Examiner—Long Pham
Assistant Examiner—Shrinivas H. Rao
(74) Attorney, Agent, or Firm—Brenda O. Holmes; Kilpatrick Stockton LLP

(57) ABSTRACT

The lateral pnp transistor encompasses a p-type semiconductor substrate, an n-type first buried region disposed on the semiconductor substrate, an n-type uniform base region disposed on the first buried region, an n-type first plug region disposed in the uniform base region, a p-type first emitter region and a first collector region disposed in and at the top surface of the uniform base region, a graded base region disposed in the uniform base region and a first base contact region disposed in the first plug region. The graded base region encloses the bottom and the side of the first main electrode region. The doping profile in the graded base region intervening between the first emitter region and the first collector region is such that the impurity concentration is gradually decreases towards the second main electrode region from the first main electrode region.

13 Claims, 9 Drawing Sheets

LATERAL TRANSISTOR HAVING GRADED BASE REGION, SEMICONDUCTOR INTEGRATED CIRCUIT AND FABRICATION METHOD THEREOF

BACKGROUND OF THE INVENTION

1. Field of the Invention

The present invention relates to a semiconductor integrated circuit, more particularly to a structure of a lateral transistor suitable for implementing a high-density monolithic integration on a semiconductor substrate.

2. Description of the Related Art

Figure 1A:
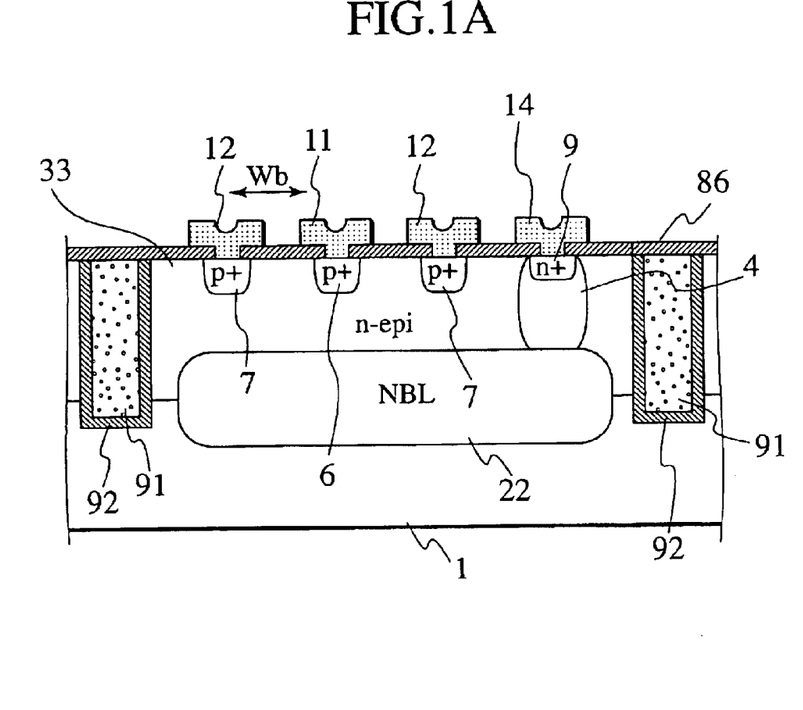
FIG. 1A is a cross sectional view of an earlier semiconductor integrated circuit having a lateral pnp transistor.
Figure 1B:
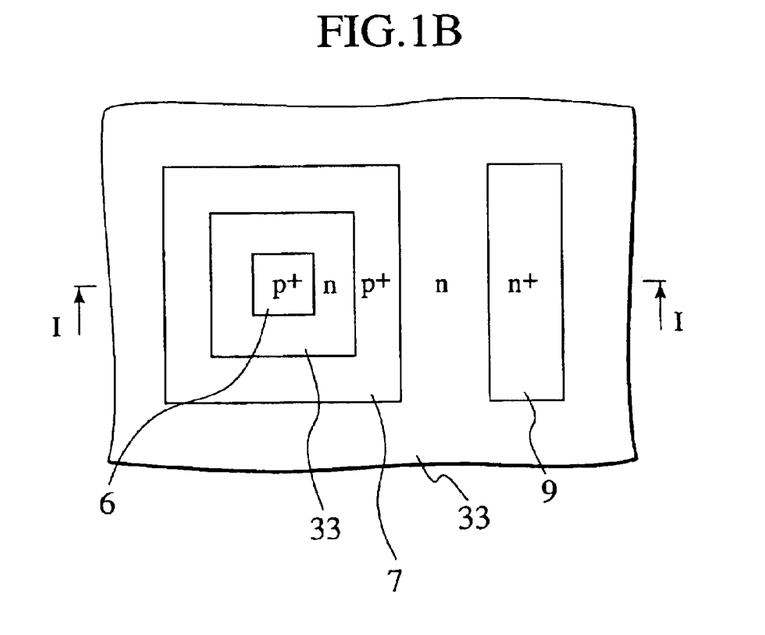
FIG. 1B is the corresponding plan view of the earlier semiconductor integrated circuit having the lateral pnp transistor.

A structure merging a power transistor and its control circuit on the same semiconductor chip so as to form a semiconductor integrated circuit is known. In such a power IC, sometimes the power transistor is made by a vertical npn transistor and the control circuit by lateral pnp transistors, the lateral pnp transistor operating with relatively lower power than the vertical npn transistor. An example of the structure of the earlier lateral pnp transistor employed in these semiconductor integrated circuits (power ICs) is shown in FIGS. 1A and 1B. That is, the earlier lateral pnp transistor embraces a semiconductor substrate 1, an n-type first buried region 22 formed on the semiconductor substrate 1, an n-type first base region 33 formed over the entire surface of the semiconductor substrate 1, an n-type first plug region 4 so formed that the bottom of the first plug region 4 reaches to the first buried region 22, a p-type first emitter region 6 and a p-type first collector region 7 formed in and at the surface of the first base region 33, and an n-type first base contact region 9 formed in and at the surface of the first plug region. The lateral pnp transistor constructed in this manner encompasses further a field insulating film 86 on the top surface. And, a first emitter wiring 11, a connecting wiring 12, and a first base wiring 14 contact through contact holes in the field insulating film 86 with the first emitter region 6, the first collector region 7 and the first base contact region 9. The connecting wiring 12 serves as a first collector wiring and is connected to the base electrode of the vertical npn transistor having a high maximum operating voltage, though the illustration of the vertical npn transistor is omitted in FIGS. 1A and 1B.

SUMMARY OF THE INVENTION

In the earlier semiconductor integrated circuit above mentioned, it is convenient for the fabrication process to construct the first base region 33 of the lateral pnp transistor and the drift region (collector region) of the high voltage vertical npn transistor with the same epitaxial layer having the same thickness and the same impurity concentration. Because the vertical npn transistor composed of a second emitter region, a second base region and a second collector region is disposed at the back of the plane of the cross section in FIG. 1A, the illustration of the vertical npn transistor is omitted. In this case, the impurity concentration of the first base region 33 of the lateral pnp transistor and of the drift region of the vertical npn transistor must be set to a relatively low value, since the vertical npn transistor is required to operate with a higher maximum operating voltage. Therefore, it is necessary to make a base width Wb of the lateral pnp transistor larger relatively in order to suppress the occurrence of "the depletion-layer punch-through" between the emitter and collector regions so as to maintain the higher breakdown voltage between the emitter and collector electrodes of the lateral pnp transistor.

However, when the base width Wb is increased in the lateral pnp transistor, the current gain decreases so as to degrade the electrical performances. Further, the occupied space of the lateral pnp transistor increases and results in undesirable lowering of the on-chip integration degree of the semiconductor elements.

In view of these situations, it is an object of the present invention to provide a lateral transistor, a semiconductor integrated circuit and a fabrication method thereof, capable of obtaining a required high breakdown voltage between the first and second main electrodes by decreasing the base width Wb. "The first main electrode region" is one of the emitter and collector regions of the bipolar transistor (BJT), if the lateral transistor is the lateral BJT. "The second main electrode region" is the other of the emitter and collector regions, if the lateral transistor is the lateral BJT. For example, if the first main electrode region is the emitter region, the second main electrode region is the collector region. Between the first and second main electrode regions, a main current controlled by the base region flows so as to form a current path between the first and second main electrode regions.

Another object of the present invention is to provide a lateral transistor, a semiconductor integrated circuit and a method of fabricating thereof, capable of decreasing the occupied area of the lateral transistor to increase the on-chip integration degree.

A further different object of the present invention is to provide a lateral transistor, a semiconductor integrated circuit and a method of fabricating thereof, capable of improving a current gain of the integrated lateral transistor.

A further different object of the present invention is to provide a lateral transistor, a semiconductor integrated circuit and a method of fabricating thereof, capable of forming a highly integrated lateral transistor by a simple process compared with the earlier fabricating method of the lateral transistor or the semiconductor integrated circuit and thus realizing a considerable cost down.

To achieve the above-mentioned objects, a first feature of the present invention lies in a lateral transistor encompassing: (a) a semiconductor substrate of the first conductivity type; (b) a buried region of the second conductivity type disposed on the semiconductor substrate; (c) a uniform base region of the second conductivity type disposed on the first buried region; (d) a plug region of the second conductivity type disposed in the uniform base region, the plug region protrudes from a top surface of the uniform base region so as to reach to the buried region; (e) first and second main electrode regions of the first conductivity type disposed in and at the top surface of the uniform base region; and (f) a graded base region of the second conductivity type disposed in the uniform base region, enclosing bottom and side of the first main electrode region, the graded base region has a doping profile such that impurity concentration decreases towards the second main electrode region from the first main electrode region. Here, the combination of the uniform base region and the graded base region serves as a base region. Here, "the first conductivity type" and "the second conductivity type" are opposite conductivity type each other. That is, when the first conductivity type is n-type, the second conductivity type is p-type, and vice versa.

According to the first feature of the present invention, it is possible to increase the impurity concentration in the graded base region of the lateral transistor relatively, compared with earlier lateral transistor. Therefore, a desired high breakdown voltage between emitter and collector (BVceo)

can be obtained by making the width of the graded base region Wb thinner compared with the earlier lateral transistor, if the lateral transistor is the lateral BJT. As the width of the graded base region Wb can be reduced, the occupied space of the lateral transistor decreases, so that the on-chip integration degree of the semiconductor integrated circuit can be increased. In addition to the reduced width of the graded base region Wb, an impurity concentration gradually decreasing from the first main electrode region to the second main electrode region achieves an optimum built-in drift field. Therefore, the transport efficiency of the carriers injected into the graded base region is increased, so that reduction of the base transit time may be obtained. Hence the current gain of the lateral transistor is improved.

A second feature of the present invention lies in a semiconductor integrated circuit including a lateral transistor, the lateral transistor encompassing: (a) a semiconductor substrate of the first conductivity type; (b) a first buried region of the second conductivity type disposed on the semiconductor substrate; (c) a uniform base region of the second conductivity type disposed on the first buried region; (d) a first plug region of the second conductivity type disposed in the uniform base region, the first plug region protrudes from a top surface of the uniform base region so as to reach to the first buried region; (e) first and second main electrode regions of the first conductivity type disposed in and at the top surface of the uniform base region; and (f) a graded base region of the second conductivity type disposed in the uniform base region, enclosing bottom and side of the first main electrode region, the graded base region has a doping profile such that impurity concentration decreases towards the second main electrode region from the first main electrode region. Here, the combination of the uniform base region and the graded base region serves as a first base region of the lateral transistor.

According to the second feature of the present invention, the base width is made narrower compared to the earlier lateral transistor, while keeping a higher required breakdown voltage between the collector and the emitter can be obtained. Further, according to the second feature, it is capable of developing the on-chip integration degree of the semiconductor integrated circuit by decreasing the occupied space for the lateral transistor. Further, according to the second feature, the current gain of the integrated lateral transistor can be improved.

A third feature of the present invention lies in a method of fabricating a semiconductor integrated circuit encompassing: (a) selectively forming a first diffusion region of the second conductivity type on a semiconductor substrate of a first conductivity type; (b) growing an epitaxial layer of the second conductivity type on the first diffusion region so as to make the first diffusion region a first buried region; (c) selectively diffusing impurity atoms of the second conductivity type so as to form a first plug region of the second conductivity type, from a top surface of the epitaxial layer such that a bottom of the first plug region reaches to the first buried region; (d) selectively diffusing impurity atoms of the second conductivity type so as to form a graded base region of the second conductivity type, from the top surface of the epitaxial layer, a lateral position of the graded base region is separated from the lateral position of the first plug region and a vertical position of the graded base region is separated from the vertical position of the first buried region, the graded base region has a doping profile such that impurity concentration decreases towards peripheral region from central region of the graded base region; (e) forming a first main electrode region of the first conductivity type in and at the top surface of the graded base region; and (f) forming a the second main electrode region of the first conductivity type, so as to sandwich the graded base region between the first and second main electrode regions, in and at the top surface of the epitaxial layer.

According to the third feature of the present invention, the graded base region formed before the formation of the first main electrode region is drove-in more deeply than the edge portion of the first main electrode region by the thermal treatment required for forming the first main electrode region. Therefore, the graded base region is formed adjacently to and surrounding the first main electrode region. It is possible to form the graded base region and the first main electrode region by the diffusion self-alignment (DSA) method using the same diffusion window. Accordingly, spreading widths of the graded base region extending laterally from the edge portions of the first main electrode region are equal in both directions and the gradient of the impurity profile can be made equal in both directions. When the graded base region is formed in ring shape surrounding the first main electrode region on the plane pattern, width of the ring-like graded base region can be formed uniformly. Therefore, formation of a highly integrated circuit with the lateral transistor by a simple process compared with the earlier method of fabricating a semiconductor integrated circuit is possible, so that considerable cost down is realized. "The diffusion window" may be a window provided in the silicon oxide film used for pre-deposition (vapor phase diffusion) or for ion implantation.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the present invention in practice.

DETAILED DESCRIPTION OF THE EMBODIMENTS

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor integrated circuits, it will be appreciated that the various drawings are not drawn to scale from one figure to another nor inside a given figure, and in particular that the layer thicknesses are arbitrarily drawn for facilitating the reading of the drawings. In the following description specific details are set fourth, such as specific materials, process and equipment in order to provide thorough understanding of the present invention. It will be apparent, however, to one skilled in the art that the present invention may be practiced without these specific details. In other instances, well-known manufacturing materials, process and equipment are not set fourth in detail in order not unnecessary obscure the present invention.

Prepositions, such as "on", "over", "under" and "above" are defined with respect to a planar surface of the substrate, regardless of the orientation the substrate is actually held. A layer is on another layer even if there are intervening layers. It being understood the indicator "+" in the Figures indicates relatively strong doping and the indicator "−" in the Figures indicates relatively weak doping. As it will be appreciated, in the above structure, the terms "emitter" and "collector" can be exchanged without modifying the structure it self.
(Semiconductor Integrated Circuit)

Figure 2A:
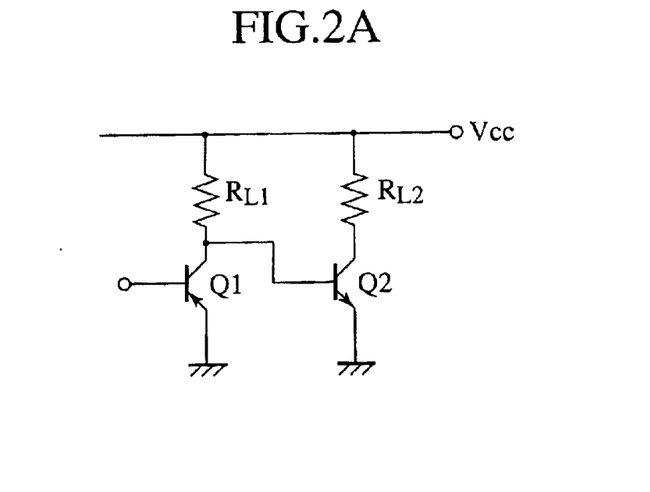
FIG. 2A is an equivalent circuit of a part of the semiconductor integrated circuit according to an embodiment of the present invention.
Figure 2B:
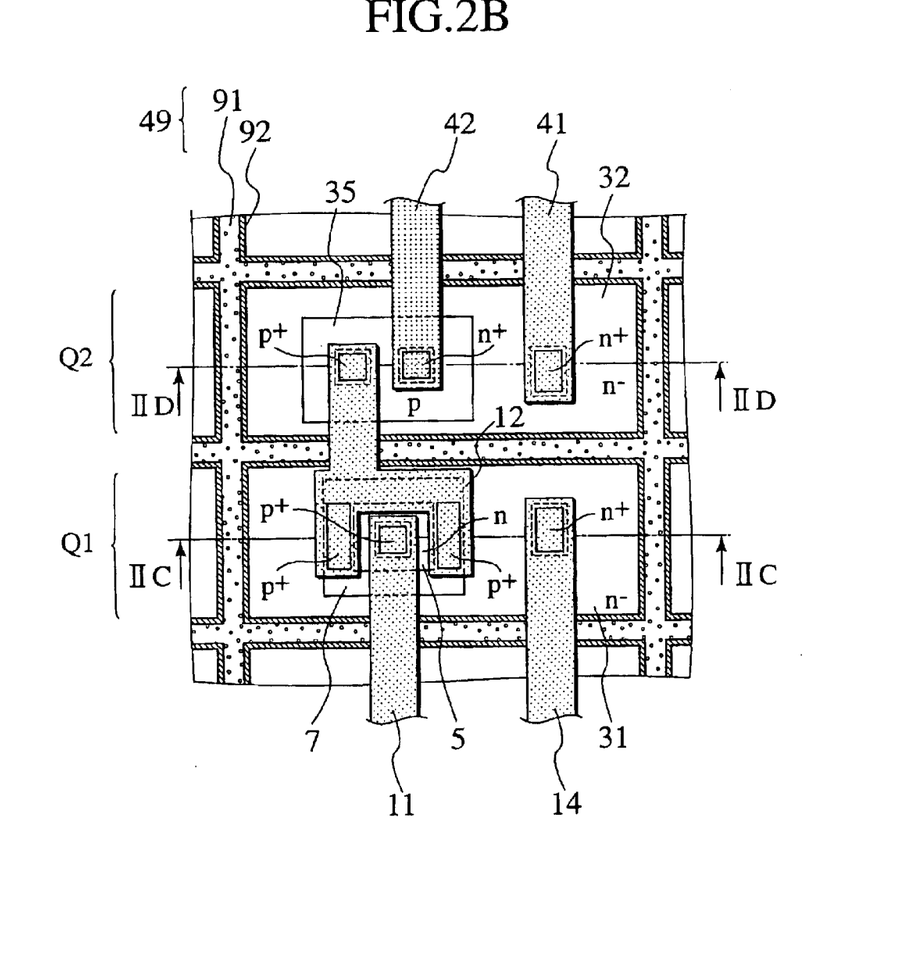
FIG. 2B is a plan view of the semiconductor integrated circuit corresponding to the semiconductor integrated circuit shown in FIG. 2A.

As shown in FIGS. 2A and 2B, the semiconductor integrated circuit according to the embodiment of the present invention is a power IC, where a power transistor constituted of the vertical npn transistor Q2 and a control transistor constituted of the lateral pnp transistor Q1, which controls the power transistor, are merged on a semiconductor substrate. As shown in FIG. 2A, a collector electrode of a lateral pnp transistor (BJT) Q1 is connected to a base electrode of a vertical npn transistor (BJT) Q2. Further, the collector electrode of the lateral pnp transistor Q1 is connected to the power supply line Vcc through a first load $R_{L1}$. And the collector electrode of vertical npn transistor Q2 is connected to the power supply line Vcc through a second load $R_{L2}$.

FIG. 2B shows a plan view corresponding to an equivalent circuit of FIG. 2A. The power transistor Q2 has a large power handling capability with a high maximum operating voltage and a high maximum current handling capability. The control transistor Q1 operate with relatively low power. Then the power transistor Q2 and the control transistor Q1 are monolithically integrated on the same semiconductor substrate.

Figure 2C:
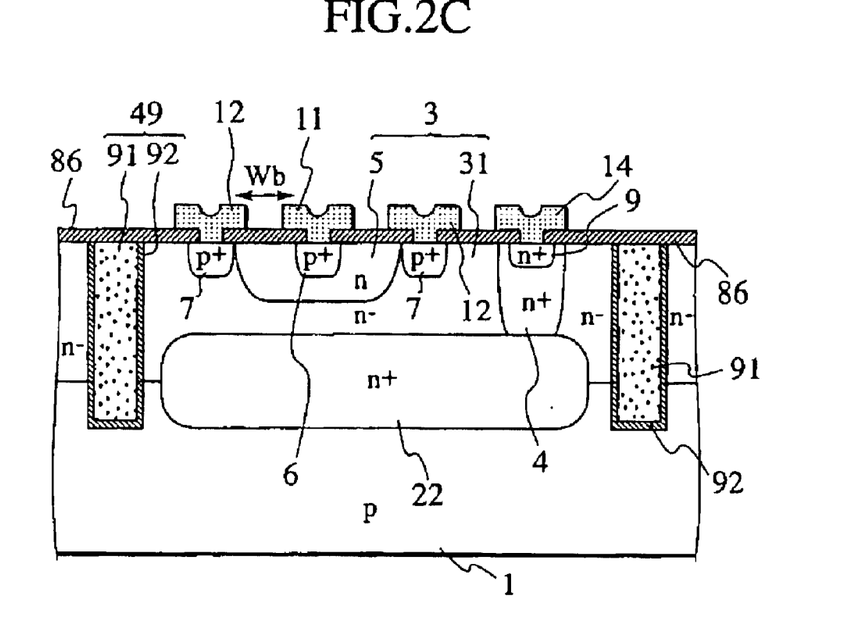
FIG. 2C is a cross sectional view taken on line A—A in FIG. 2B.

As shown in FIGS. 2B and 2C, the lateral pnp transistor Q1 encompasses a p-type (first conductivity type) semiconductor substrate 1, a heavily doped n-type (second conductivity type) first buried region 22 disposed on the semiconductor substrate 1, a lightly doped n-type uniform base region 31 disposed on the first buried region 22 and on the semiconductor substrate 1, a heavily doped n-type first plug region 4 disposed in the uniform base region 31, a heavily doped p-type first emitter region (first main electrode region) 6 and a heavily doped p-type first collector region (second main electrode region) 7 disposed in and at the top surface of the uniform base region 31, an n-type graded base region 5 disposed in the uniform base region 31 and a heavily doped n-type first base contact region 9 disposed in and at the top surface of the first plug region 4. The first plug region 4 protrudes from the top surface of the uniform base region 31 so as to reach to the first buried region 22. The graded base region 5 encloses the bottom and the side of the first main electrode region 6. The combination of the uniform base region 31 and the graded base region 5 serves as a first base region of the lateral transistor Q1.

As the semiconductor substrate 1, silicon (Si) substrate can be employed. An element isolation region 49, configured to isolate the lateral pnp transistor Q1 from other semiconductor elements surrounds the lateral pnp transistor Q1. The element isolation region 49 is constituted by a trench-surface insulating film 92 covering the surface of an element isolation trench formed so as to reach the semiconductor substrate 1 and a buried insulating film 91 formed thereon.

On the top surface of the lateral pnp transistor Q1 a field insulating film 86 is formed. Through contact holes formed in the field insulating film 86, a first emitter wiring 11, a connecting wiring 12 and a first base wiring 14 are connected to the first emitter region 6, the first collector region 7 and the first contact region 9, respectively. The connecting wiring 12 serves as a first collector wiring and connected to a second base contact region of the vertical npn transistor Q2. The first emitter wiring 11, the connecting wiring 12 and the first base wiring 14 are made by aluminum alloy film. As the aluminum alloy film, for example, Al—Si or Al—Cu—Si film can be employed.

Figure 2D:
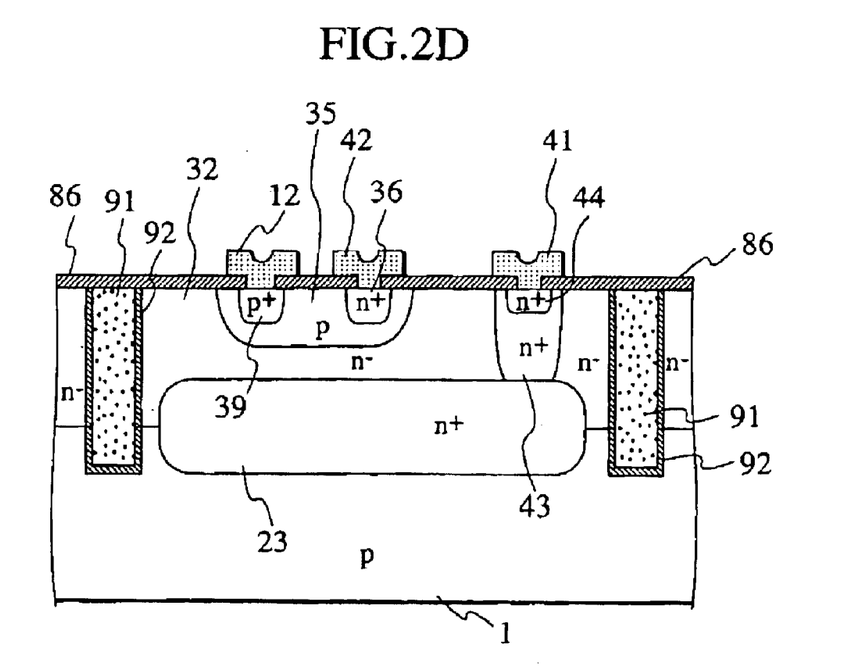
FIG. 2D is a cross sectional view taken on line B—B in FIG. 2B.

As shown in FIG. 2D, the vertical npn transistor Q2 encompasses the p-type semiconductor substrate 1, a heavily doped n-type second buried region (serving as a part of a third main electrode region) 23 disposed on the p-type semiconductor substrate 1, a lightly doped n-type drift region 32 disposed on the second buried region 23 and on the semiconductor substrate 1, a heavily doped n-type second plug region 43 formed to reach the second buried region 23, a p-type second base region 35 disposed in and at the top surface of the drift region 32, a heavily doped n-type second emitter region (fourth main electrode region) 36 and a heavily doped p-type second base contact region 39 formed in and at the top surface of the second base region 35, and a heavily doped n-type second collector contact region 44 formed in and at the top surface of the second plug region 43. The vertical npn transistor Q2 is surrounded by the element isolation region 49, composed of the trench-surface insulating film 92 and the buried insulating film 91 formed thereon, similarly to the lateral pnp transistor Q1. Then the element isolation region 49 is disposed between the uniform base region 31 and the drift region 32. On the top surface of the vertical npn transistor Q2, the field insulating film 86 is formed similarly to the lateral pnp transistor Q1. A second emitter wiring 42, a connecting wiring 12 and a second collector wiring 41 are connected to the second emitter region 36, the second base contact region 39 and the second collector contact region 44, respectively. The connecting wiring 12 is extended from the first collector region 7 of the lateral pnp transistor Q1. The second emitter wiring 42, the connecting wiring 12 and the second collector wiring 41 are made of the aluminum alloy films.

Figure 4:
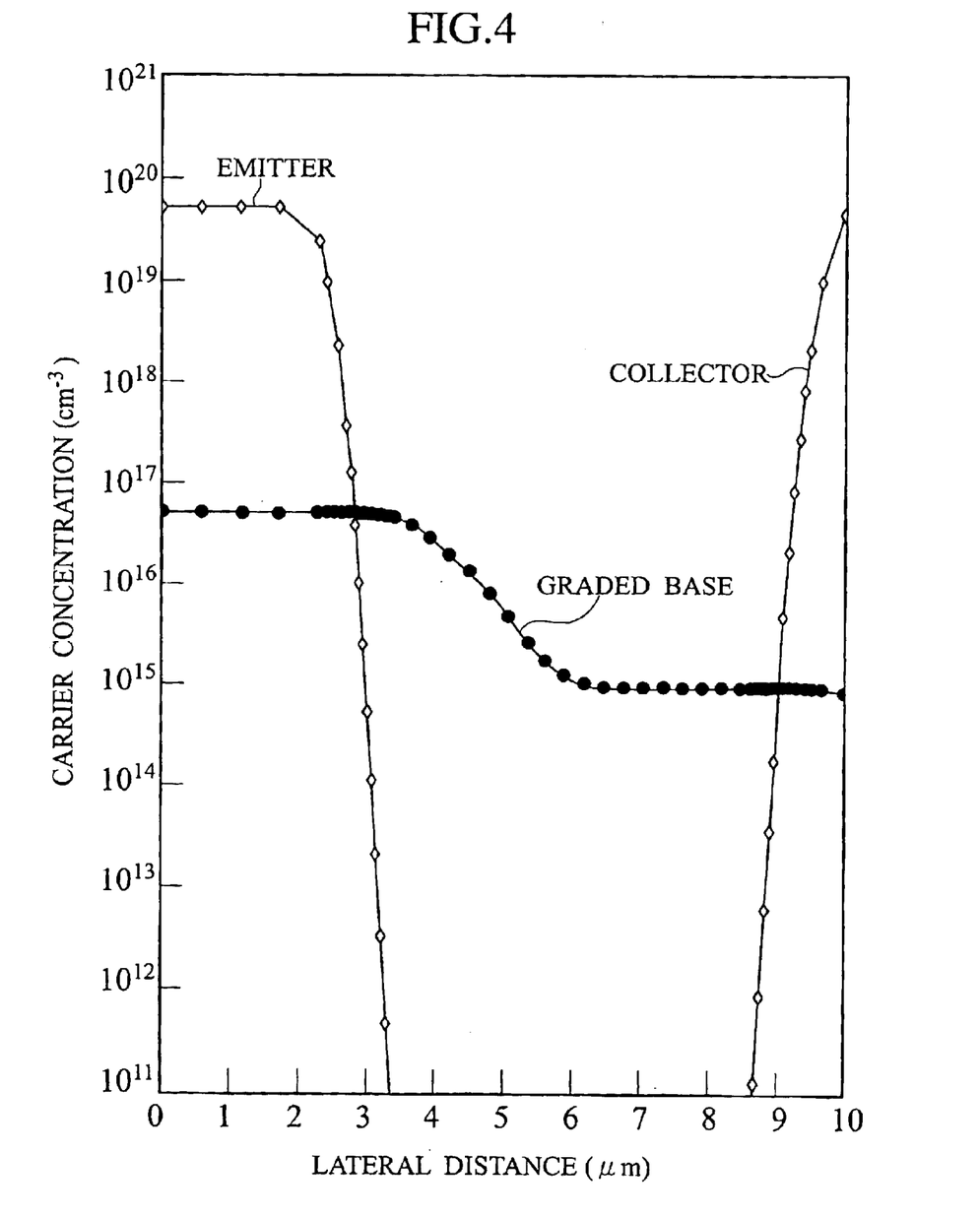
FIG. 4 illustrates the carrier concentration along the lateral direction in the lateral pnp transistor.

In the semiconductor integrated circuit according to the embodiment of the present invention, the n-type graded base region 5 is so formed as to enclose the adjoining p-type first emitter region 6 of the lateral pnp transistor Q1. As shown in FIG. 4, the doping profile in the graded base region 5 intervening between the first main electrode region (the first emitter region) 6 and the second main electrode region (the first collector region) 7 is such that the impurity concentration (the carrier concentration) is gradually decreased towards the second main electrode region 7 from the first main electrode region 6. In FIG. 4, the carrier concentration (the donor concentration) of the graded base region 5 gradually decreases from $5 \times 10^{16}$ cm$^{-3}$ to $1 \times 10^{15}$ cm$^{-3}$ along the lateral direction. The minimum impurity concentration of $1\times10^{15}$ cm$^{-3}$ corresponds to the impurity concentration of the uniform base region 31. By forming the graded base region 5 so as to enclose the adjoining first emitter region 6, the maximum impurity concentration of the graded base region 5 in the lateral pnp transistor Q1 can be increased relative to that in the uniform base region 31. As the result, the base width Wb is reduced compared to the earlier lateral pnp transistor Q1, so that a desired high break down voltage between collector and emitter (BV$_{ceo}$) can be obtained. Further, in the semiconductor integrated circuit according to the embodiment of the present invention, the base width Wb can be reduced, so that the occupied space of the lateral pnp transistor Q1 decreases. As the result, the on-chip integration degree of the semiconductor integrated circuit can be raised. Further, in addition to the geometrical merit of the miniaturized base width Wb, the profile such that the impurity concentration in the graded base region 5 is gradually decreased from the first emitter region 6 to the first collector region 7 provides an optimum built-in drift field, which can promote the carrier transport in the base region. Hence, an increase of the transport efficiency of the carriers injected into the first base region 3 and a reduction of the base transit time can be obtained, resulting in a development of the current gain.

(Fabrication Method)

Next, a method of fabricating a semiconductor integrated circuit according to the embodiment of the present invention will be described referring to from FIG. 3 to FIG. 7.

Figure 3A:
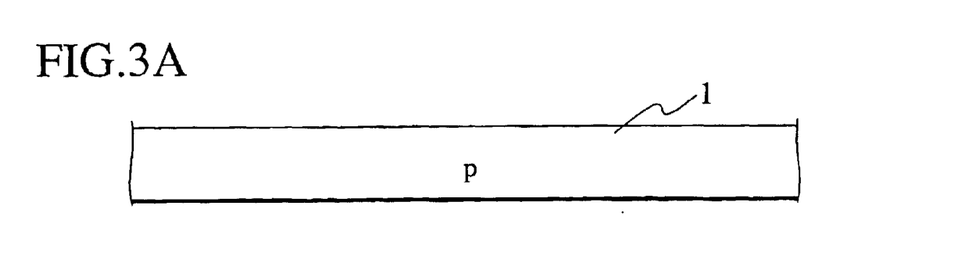
FIGS. 3A–3P illustrate cross sectional views showing the flow of the method for fabricating the semiconductor integrated circuit according to the embodiment of the present invention.
Figure 3B:
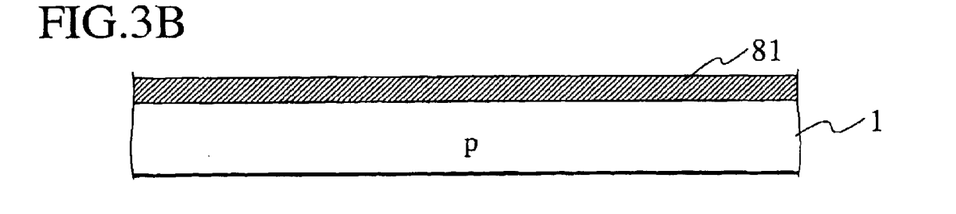
Figure 3C:
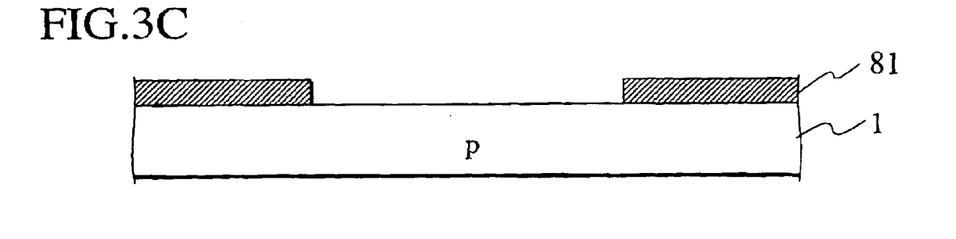
Figure 3D:
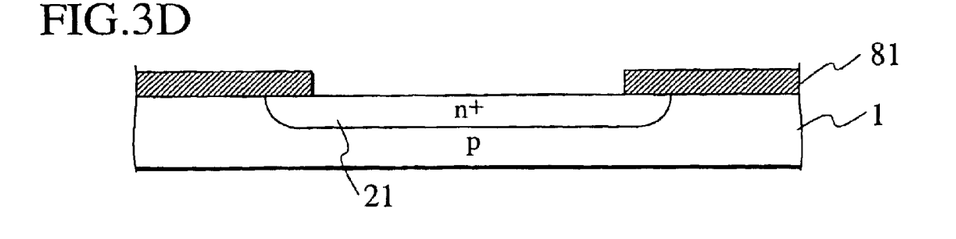

(a) First, a semiconductor substrate 1 made of p-type silicon is prepared as shown in FIG. 3A, and a silicon oxide film 81 of 300 to 600 nm in thickness is formed on the main surface thereof by thermal oxidation as shown in FIG. 3B. Thereafter, the silicon oxide film 81 is delineated by lithography technology and then a diffusion window is opened to form first and second n-type buried regions as shown in FIG. 3C. Using the silicon oxide film 81 as a mask for ion implantation, n-type impurity ions (for example, $^{31}$P$^+$) are implanted. After that, by activation annealing an n$^+$ diffusion region 21 for the first buried region is formed as shown in FIG. 3D. Simultaneously, by the activation annealing, an n$^+$ diffusion region for the second buried region is formed. Here, the second buried region is not shown in FIG. 3D, because it is located at the back of the plane of the paper.

Figure 3E:
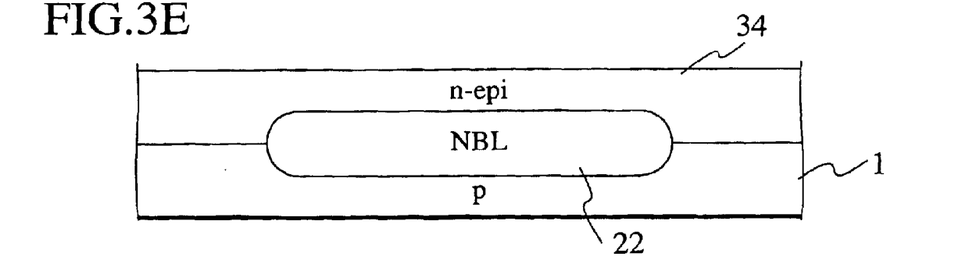

(b) Next, removing the silicon oxide film 81, a relatively high resistivity n-type epitaxial layer 34 is grown on the n$^+$ diffusion layer 21 to a thickness of 5 to 50 μm as shown in FIG. 3E. The resistivity of the n-type epitaxial layer 34 may be from 1 kΩ·cm to 1 kΩ·cm, for example. The first buried region 22 is formed at an interface between the relatively high resistivity epitaxial layer 34 and the semiconductor substrate 1. The first buried region 22 protrudes upwards by the auto-doping and the upward diffusion of the n-type impurity in the n$^+$ diffusion layer 21 during the epitaxial growth. The relatively high resistivity epitaxial layer 34 above the first buried region 22 serves as the uniform base region 31 of the lateral pnp transistor Q1. On the other hand, at the back of the page, the second buried region is also formed at an interface between the relatively high resistivity epitaxial layer 34 and the semiconductor substrate 1. The relatively high resistivity epitaxial layer 34 formed on the second buried region 23 serves as the drift region 32 of the vertical npn transistor Q2.

Figure 3F:
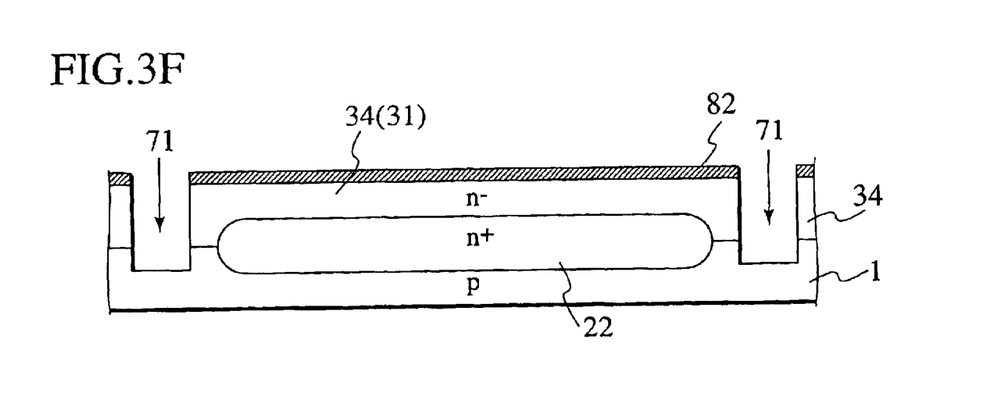
Figure 3G:
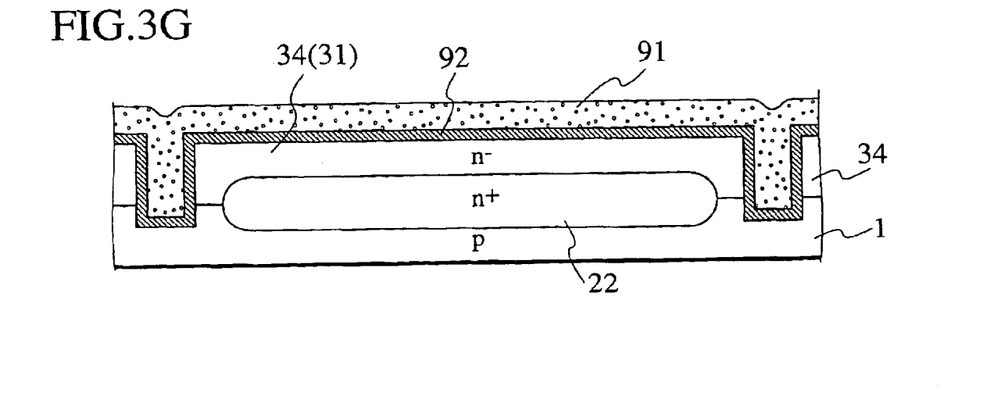

(c) Next, a silicon oxide film 82 from 500 nm to 1 μm in thickness is formed on the top surface of the relatively high resistivity epitaxial layer 34 (31, 32) by thermal oxidation. The silicon oxide film 82 is selectively etched by etching method such as the reactive ion etching (RIE) method using resist film delineated by lithography process as an etching mask. After removing the resist film, an etching mask made of the silicon oxide film 82, having windows for the formation of trenches for element isolation, is formed as shown in FIG. 3F. Using this etching mask 82, element isolation trenches 71 are dug by the RIE method or another method until a part of the semiconductor substrate 1 is exposed. The element isolation trench 71 is dug from the top surface of the relatively high resistivity epitaxial layer 34 towards the semiconductor substrate 1, surrounding each of the uniform base regions 31 and the drift regions 32. Next, after removing the silicon oxide film 82, the trench-surface insulating film 92 is formed by thermally oxidizing the surface of the element isolation trench 71 by 100 nm to 500 nm. Further, insulating film 91 such as a semi-insulating polysilicon (SIPOS) film is deposited on the trench-surface insulating film 92 by CVD method so as to bury the element isolation trench 71 with the buried insulating film 91 as shown in FIG. 3G.

Figure 3H:
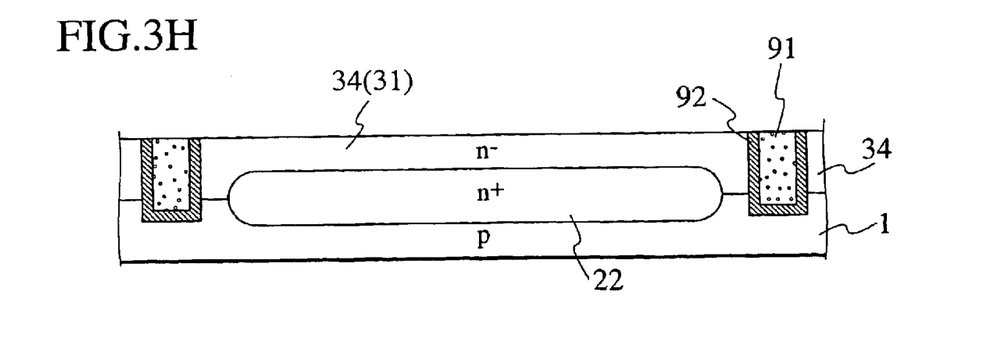
Figure 3I:
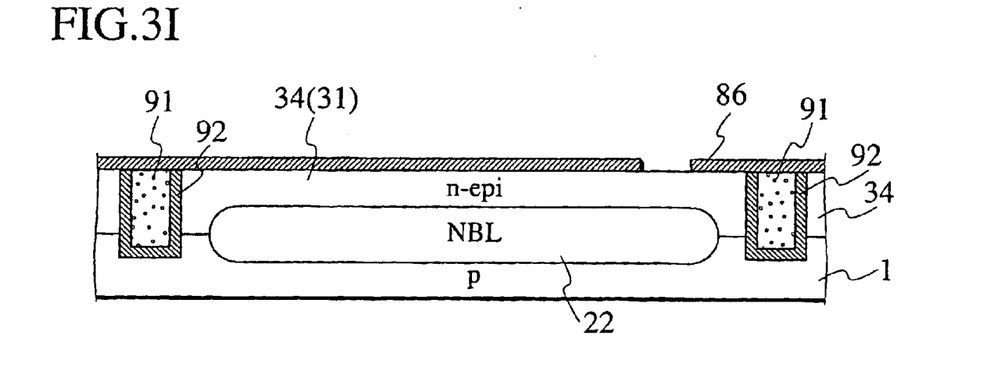
Figure 3J:
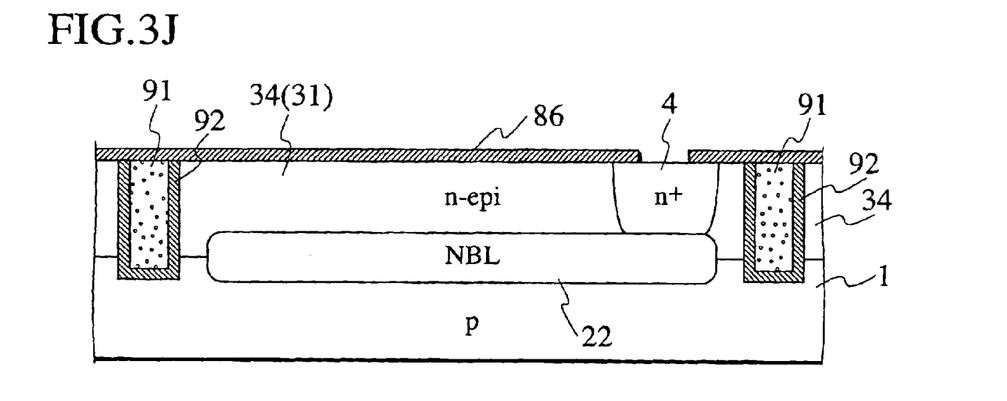

(d) Next, the trench-surface insulating film 92 and the buried insulating film 91 are perfectly embedded only inside the element isolation trench 71 by planarization until the surface of the relatively high resistivity epitaxial layer 34 is exposed and thus the element isolation region is completed as shown in FIG. 3H. The planarization process may be executed by the chemical mechanical polishing (CMP) method. Thereafter, a silicon oxide film 86, which serves as the field oxide film, is newly formed to a thickness of about 300 nm to 600 nm on the top surface of the relatively high resistivity epitaxial layer 34 (uniform base region 31) as shown in FIG. 3I. And the silicon oxide film 86 is delineated by photolithography technology and RIE method so as to define diffusion windows corresponding to first and second plug regions. Through this diffusion windows n-type impurity ions are implanted and thereafter activation annealing and drive-in annealing are done in an inert gas ambient to complete a first plug region 4 as shown in FIG. 3J. As disposed at the back of the paper, not shown in the figure, a second plug region 43 is also formed. Here, the inert gas is, for example, nitrogen (N$_2$), argon (Ar), or helium (He). A trace of oxygen (O$_2$) can be contained in these inert gasses. In the present invention, "the inert gas" includes the gas containing a trace of oxygen.

Figure 3K:
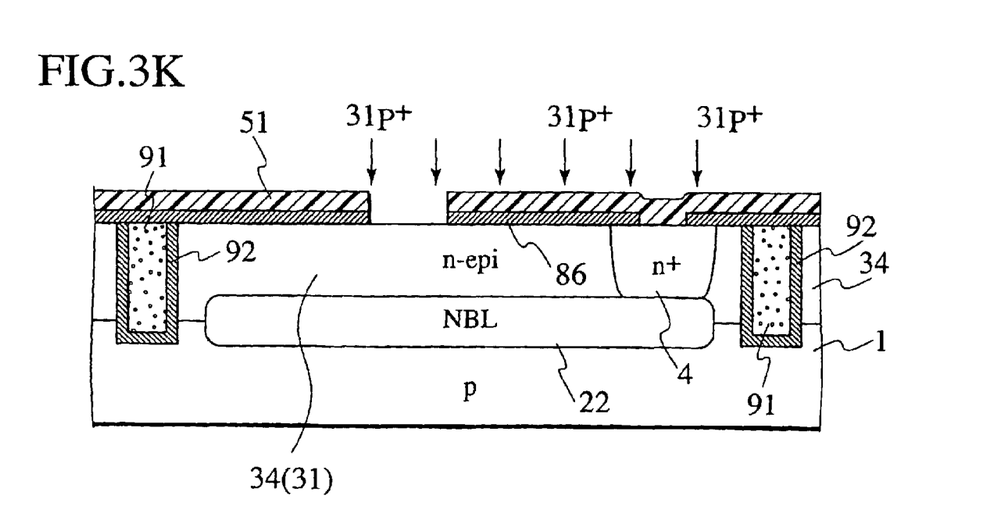
Figure 3L:
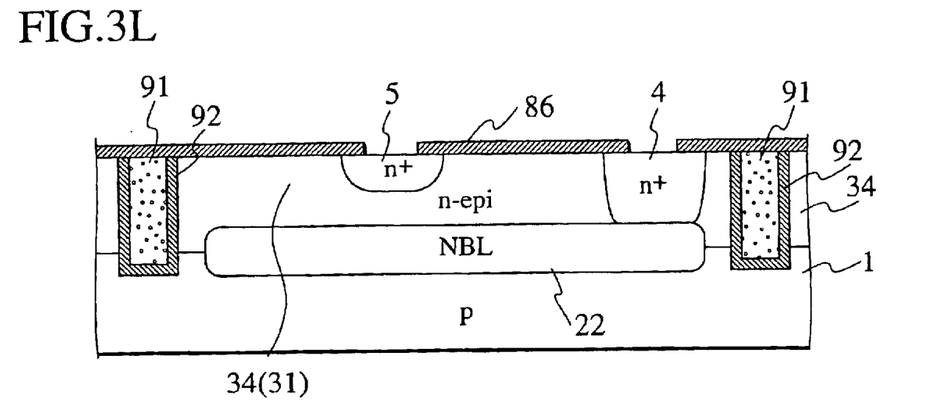

(e) Next, after spin-coating a resist film 51 on the top surface oxide film 86, a diffusion window is opened in an area of the resist film 51, under which the emitter region is scheduled to be located, using the photolithography technology as shown in FIG. 3K. Further, the silicon oxide film 86 is etched by RIE method or another method using the resist film 51 as the etching mask and thus the surface of the relatively high resistivity epitaxial layer 34 (uniform base region 31) is exposed. The n-type impurity ions such as $^{31}$P$^+$ are selectively implanted using the resist film 51 and the silicon oxide film 86 as the implantation mask as shown in FIG. 3K. After removing the resist film 51, a new resist film is spin-coated and using photolithography technology the upper portion of the first emitter region is covered and a diffusion window is opened in an area, under which the second base region is scheduled to be disposed. The area scheduled to serve as the second base region is located at the back of the plane of the paper, so that it is not shown in the figure. Using this resist film as the etching mask, the silicon oxide film 86 is etched to expose the surface of the drift region 32. The p-type impurity ions such as $^{11}B^+$ are selectively implanted using the resist film and the silicon oxide film 86 as the implantation mask. After removing the resist film, the activation annealing of implanted $^{31}P^+$ and $^{11}B^+$ is simultaneously done in an inert gas ambient. Then, the n-type graded base region 5 is formed as shown in FIG. 3L. Simultaneously, in the area for forming the vertical npn transistor Q2, the p-type second base region 35 is formed by this activation annealing (The second base region 35 is not shown in FIG. 3L as it is located at the back of the plane of the paper).

Figure 3M:
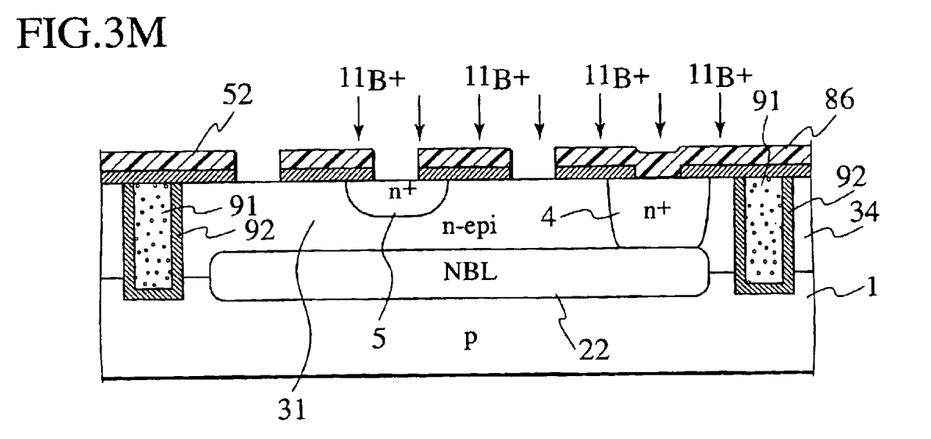

(f) Further, a new resist film 52 is spin-coated on the silicon oxide film 86 and windows are opened for the regions scheduled to be the first emitter region, the first collector region and the second base contact region by the photolithography technology as shown in FIG. 3M, respectively. The scheduled region for the second base contact region is not shown in the figure, as it is located at the back of the plane of the paper. Further, the silicon oxide film 86 is selectively etched by RIE method or another method, using the resist film 52 as an etching mask, so as to expose a part of the surface of the relatively high resistivity epitaxial layer 34. The p-type impurity ions (for example, $^{11}B^+$) are selectively implanted using the resist film 52 having windows as the implantation mask as shown in FIG. 3M.

Figure 3N:
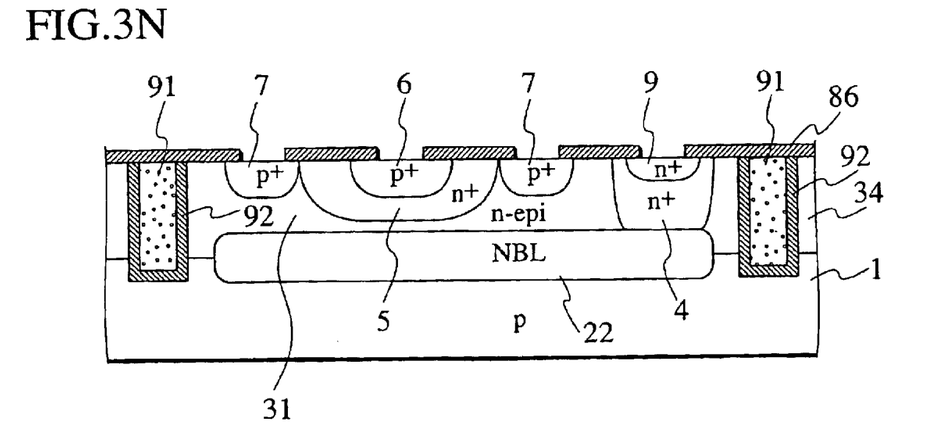

(g) Next, removing the resist film 52 a new resist film is spin-coated over the entire surface. Using this new resist film, the upper portions of a first emitter region 6, a first collector region 7 and a second base contact region 39 are covered. Then the diffusion windows are opened in the scheduled areas for the formations of a first base contact region, a second emitter region and a second collector contact region. The scheduled second emitter and the second collector regions are not shown in the figure, as those are located at the back of the page. The window of the first base contact region is positioned at a back of the location of the first plug region 4. The n-type impurity ions (for example, $^{75}As^+$) are selectively implanted. Thereafter, removing the resist film, an activation annealing is done in the inert gas ambient. As the result, the first emitter region 6, the first collector region 7 and the first base contact region 9 are formed as shown in FIG. 3N. At the same time, this activation annealing also forms the second base contact region, the second emitter region 36 and the second collector contact region 44. At this time, the graded base region 5 previously drove-in is more deeply drove-in than the edge of the first emitter region 6. As the result, the graded base region 5 is formed surrounding the first emitter region 6. That is, the graded base region 5 and the first emitter region 6 are formed self-aligned by the DSA method using the same diffusion mask. Then the spreading widths of the graded base region 5 extending from the edges of the first emitter region in FIG. 3N are equal in right and left directions. The gradients of the impurity profile in both directions are also equal. In the oppositely faced two directions perpendicular to the plane of the paper, the spreading widths of the graded base region 5 are also equal. Further, according to the embodiment of the present invention, the diffusion depth is controlled so that the edge portion of the graded base region reaches the edge portion of the first collector region 7 by lateral diffusion. However, the graded base region 5 is not necessary to reach the first collector region 7.

Figure 3O:
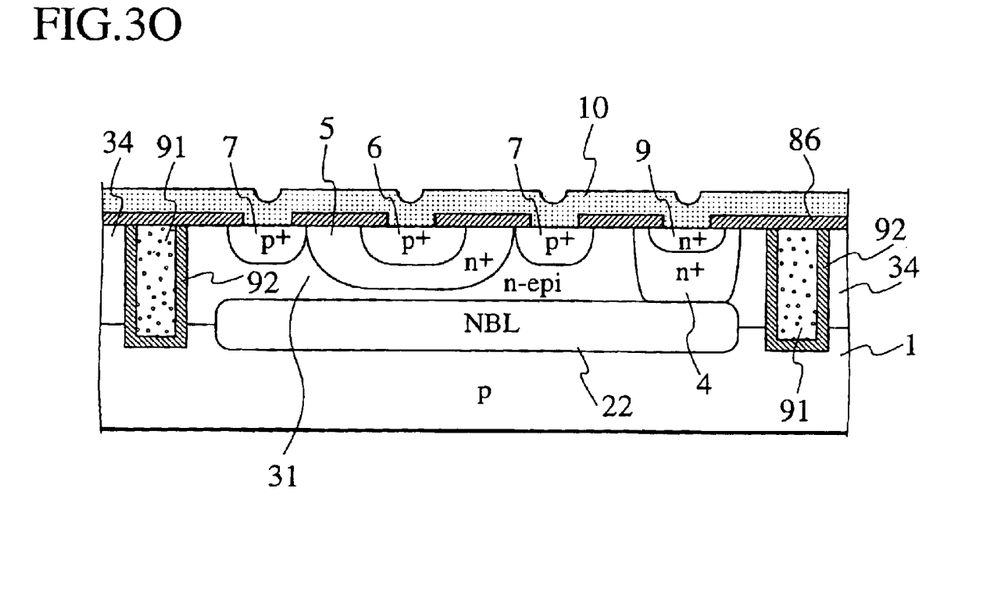
Figure 3P:
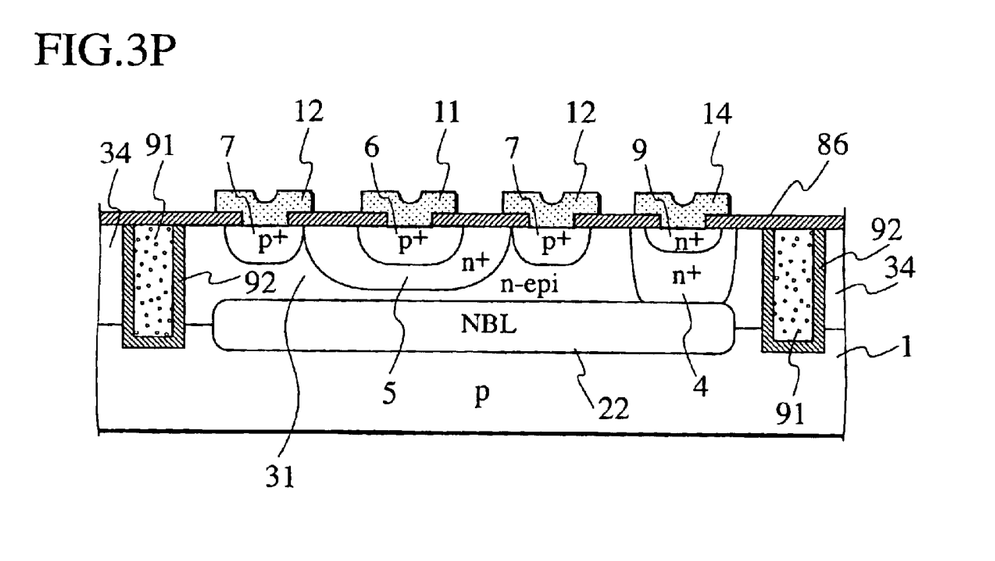

(h) According to the activation annealing in an inert gas ambient at the formation of the first emitter region 6, the first collector region 7, the first base contact region 9, the second base contact region 39, the second emitter region 36, the second collector contact region 44 or another region, the respective diffusion windows used for the ion implantation can be employed as they are, as the contact windows for the metallization. That is, at the activation annealing for forming these regions 6, 7, 9, 39, 36 and 44, silicon oxide film is not grown on the top surface of the relatively high resistivity epitaxial layer 34 exposed on the diffusion window. If a thin silicon oxide film is grown in the diffusion window, when the annealing atmosphere contains a trace of oxygen, it can be removed by slight etching. An aluminum alloy film 10 is deposited by the sputtering method or the electron beam (EB) vacuum evaporation method on the silicon oxide film 86 as shown in FIG. 3O. The resist film is spin-coated thereon and delineated to form the mask for metallization. Using this metallization mask, the aluminum alloy film 10 is selectively etched by RIE method. As the result, the aluminum alloy 10 is delineated as shown in FIG. 3P and thus the connecting wiring 12, the first emitter wiring 11, the first base wiring 14, the second emitter wiring 42 and the second collector wiring 41 are formed. Thereafter, the photoresist film used for patterning of the electrode wiring is removed. Passivation films of about 600 nm to 1.5 $\mu$m thick for the purposes of mechanical damage protection and prevention of entrance of moisture and impurity are laminated on the first emitter wiring 11, the first base wiring 14, the connecting wiring 12, the second emitter wiring 42 and the second wiring 41 by CVD method, though not shown in the figure. For the passivation films, silicon oxide film, phosphosilicate glass (PSG) film, borophosphate-silicate glass (BPSG) film, silicon nitride film ($Si_3N_4$ film) or their complex film and further polyimide film are used.

In the method of fabricating a semiconductor integrated circuit according to the embodiment of the present invention, the graded base region 5 formed previously is drove-in more deeply than the first emitter region 6, so that encloses the adjacent first emitter region 6. The graded base region 5 and the first emitter region 6 are formed self-aligned by the DSA method using the same diffusion mask. As the result, the spreading width of the graded base region from the edge portion of the first emitter region 6 and also the gradient of the doping profile are equal in the right and the left directions. Therefore, formation of a highly packed integrated circuit with BJT is possible, achieving a considerable cost down.

Other Embodiments

Various modifications will become possible for those skilled in the art after receiving the teaching of the present disclosure without departing from the scope thereof.

For example, although it has been described that the first conductivity type is p-type and the second one is n-type in the above-mentioned embodiment, of course the first conductivity type may be n-type and the second conductivity type may be p-type. Though it has been described that the element isolation region 49 is a dielectric isolation (DI)

structure composed of the trench surface insulation film 92 and the buried insulation film 91, it may be a junction isolation (JI) structure. The present invention is applicable to not only power IC but also logic integrated circuit for small signal. The element isolation region can be omitted corresponding to the circuit topology such as an integrated injection logic (IIL) circuit. Further, corresponding to the circuit configuration for integration, the first buried region 22 and the second buried region 23 may be formed either in common or separately on the same semiconductor substrate 1. The first plug region 4 and the second plug region 43 are formed either in common or separately on the same semiconductor substrate. Further, the above-mentioned embodiment has been described in the case of using Si substrate, however, silicon carbide (SiC), gallium arsenide (GaAs), indium phosphide (InP) or another semiconductor material can of course be used.

Thus, the present invention of course includes various embodiments and modifications and the like which are not detailed above. Therefore, the scope of the present invention will be defined in the following claims.

What is claimed is:

1. A lateral transistor comprising;
   a semiconductor substrate of a first conductivity type;
   a buried base region of a second conductivity type opposite to the first conductivity type, disposed on said semiconductor substrate;
   a uniform base region of the second conductivity type disposed on said first buried base region, the uniform base region having a uniform lateral doping profile, the lateral doping profile being measured along a lateral direction parallel to the top surface of said semiconductor substrate;
   a plug region of the second conductivity type disposed in said uniform base region, the plug region protrudes from a top surface of said uniform base region so as to reach to said buried base region;
   a first main electrode region of the first conductivity type disposed in and at the top surface of said uniform base region;
   a graded base region of the second conductivity type disposed in said uniform base region, enclosing bottom and side of said first main electrode region such that said first main electrode region is disposed in the center at the top surface of the graded base region, the graded base region having a doping profile such that impurity concentration decreases gradually along the lateral direction towards said second main electrode region from said first main electrode region when the lateral transistor is not biased, and
   a second main electrode region of the first conductivity type disposed in and at the top surface of said uniform base region so as to directly contact with said uniform base region, the second main electrode region being aligned in the lateral direction with the first main electrode region configured such that a main current of the lateral transistor flows along the lateral direction between the first and second main electrode regions,
   wherein a combination of said buried base region, said uniform base region and said graded base region serves as a base region.

2. The lateral transistor of claim 1, wherein said second main electrode region is formed in a frame shape along the top surface of said uniform base region, configured such that said second main electrode region laterally surrounds said graded base region.

3. The lateral transistor of claim 2, wherein said second main electrode region is formed in a rectangular frame shape.

4. The lateral transistor of claim 1, further comprising a base contact region disposed in and at a top surface of said plug region.

5. The lateral transistor of claim 2, further comprising a base wiring being in contact with said base contact region.

6. A semiconductor integrated circuit including a lateral transistor, the lateral transistor comprising:
   a semiconductor substrate of a first conductivity type;
   a first buried region of a second conductivity type opposite to the first conductivity type, disposed on said semiconductor substrate;
   a uniform base region of the second conductivity type disposed on said first buried region, the uniform base region having a uniform lateral doping profile, the lateral doping profile being measured along a lateral direction parallel to the top surface of said semiconductor substrate;
   a first plug region of the second conductivity type disposed in said uniform base region, the first plug region protrudes from a top surface of said uniform base region so as to reach to said first buried region;
   a first main electrode region of the first conductivity type disposed in and at the top surface of said uniform base region;
   a graded base region of the second conductivity type disposed in said uniform base region, enclosing bottom and side of said first main electrode region such that said first main electrode region is disposed in the center at the top surface of the graded base region, the graded base region having a doping profile such that impurity concentration decreases gradually along the lateral direction towards said second main electrode region from said first main electrode region when the lateral transistor is not biased, and
   a second main electrode region of the first conductivity type disposed in and at the top surface of said uniform base region so as to directly contact with said uniform base region, the second main electrode region being aligned in the lateral direction with the first main electrode region configured such that a main current of the lateral transistor flows along the lateral direction between the first and second main electrode regions,
   wherein a combination of said first buried regions said uniform base region and said graded base region serves as a first base region of said lateral transistor.

7. The semiconductor integrated circuit of claim 6, further including a vertical transistor, the vertical transistor comprising:
   a second buried region of the second conductivity type disposed on said semiconductor substrate, the second buried region serving as a part of a third main electrode region of said vertical transistor;
   a drift region of the second conductivity type disposed on said second buried region;
   a second base region of the first conductivity type disposed in said drift region; and
   a fourth main electrode region of the second conductivity type disposed in said second base region, configured such that a main current of the vertical transistor flows along a vertical direction to the top surface of said semiconductor substrate, the main current flows between the third and fourth main electrode regions.

8. The semiconductor integrated circuit of claim 7, further comprising a connecting wiring configured to connect said second main electrode region and second base region.

9. The semiconductor integrated circuit of claim 7, further comprising an element isolation region disposed between said uniform base region and said drift region.

10. The lateral transistor of claim 7, wherein said second main electrode region is formed in a frame shape along the top surface of said uniform base region, configured such that said second main electrode region laterally surrounds said graded base region.

11. The lateral transistor of claim 10, wherein said second main electrode region is formed in a rectangular frame shape.

12. The lateral transistor of claim 7, further comprising a first base contact region disposed in and at a top surface of said first plug region.

13. The lateral transistor of claim 12, further comprising a first base wiring being in contact with said first base contact region.

* * * * *